United States Patent

Hause et al.

[11] Patent Number: 5,953,626
[45] Date of Patent: Sep. 14, 1999

[54] DISSOLVABLE DIELECTRIC METHOD

[75] Inventors: Fred N. Hause; Basab Bandyopadhyay; Robert Dawson; H. Jim Fulford, Jr.; Mark W. Michael; William S. Brennan, all of Austin, Tex.

[73] Assignee: Advanced Micro Devices, Inc.

[21] Appl. No.: 08/659,166

[22] Filed: Jun. 5, 1996

[51] Int. Cl.⁶ ............................................ H01L 21/4763
[52] U.S. Cl. .................... 438/622; 438/593; 438/637; 438/692
[58] Field of Search .................................... 438/152, 158, 438/207, 210, 234, 593, 622, 637, 692

[56] References Cited

U.S. PATENT DOCUMENTS

| | | | |
|---|---|---|---|
| 4,182,023 | 1/1980 | Cohen et al. | 29/571 |
| 4,675,074 | 6/1987 | Wada et al. | 156/647 |
| 4,899,439 | 2/1990 | Potter et al. | 29/846 |
| 4,920,639 | 5/1990 | Yee | 29/846 |
| 5,001,079 | 3/1991 | Van Laarhoven et al. | 437/50 |
| 5,117,276 | 5/1992 | Thomas et al. | 357/71 |
| 5,272,100 | 12/1993 | Satoh et al. | 437/29 |
| 5,310,700 | 5/1994 | Lien et al. | 437/195 |
| 5,324,683 | 6/1994 | Fitch et al. | 437/655 |
| 5,386,142 | 1/1995 | Kurtz et al. | 257/690 |
| 5,393,709 | 2/1995 | Lur et al. | 437/228 |
| 5,407,860 | 4/1995 | Stoltz et al. | 437/180 |
| 5,426,072 | 6/1995 | Finnila | 437/208 |
| 5,444,015 | 8/1995 | Aitken et al. | 437/182 |
| 5,462,884 | 10/1995 | Taniguchi | 437/34 |
| 5,512,775 | 4/1996 | Cho | 257/522 |
| 5,559,049 | 9/1996 | Cho | 437/44 |
| 5,559,055 | 9/1996 | Chang et al. | 437/195 |
| 5,567,982 | 10/1996 | Bartelink | 257/664 |
| 5,665,632 | 9/1997 | Lur et al. | 438/422 |
| 5,716,861 | 2/1998 | Moslehi | 437/40 |
| 5,741,736 | 4/1998 | Orlowski | 438/286 |
| 5,759,913 | 6/1998 | Fulford, Jr. et al. | 438/624 |
| 5,783,864 | 7/1998 | Dawson et al. | 257/758 |
| 5,832,601 | 11/1993 | Eldridge et al. | 29/843 |

FOREIGN PATENT DOCUMENTS

| | | |
|---|---|---|
| 63-179548 | 7/1988 | Japan . |
| 1-296641 | 11/1989 | Japan . |
| 5-206120 | 8/1993 | Japan . |

OTHER PUBLICATIONS

Wolf, "Silicon Processing for the VLSI Era–vol. 2," 1990 Ed., p. 198. (no month).

*Primary Examiner*—Charles Bowers
*Assistant Examiner*—Reneé R. Berry
*Attorney, Agent, or Firm*—Kevin L. Daffer; Conley, Rose & Tayon

[57] ABSTRACT

A fabrication process that produces an air gap dielectric in which a multi-level interconnect structure is formed upon a temporary supporting material. The temporary material is subsequently dissolved away leaving behind an intralevel and an interlevel dielectric comprised of air. In one embodiment of the invention, a first interconnect level is formed on a barrier layer. A temporary support material is then formed over the first interconnect level and a second level of interconnect is formed on the temporary support material. Prior to formation of the second interconnect level, a plurality of pillar openings are formed in the temporary material and filled with a conductive material. In addition to providing a contact between the first and second level of interconnects, the pillars provide mechanical support for the second interconnect level. The temporary material is dissolved in a solution that attacks the temporary material but leaves the interconnect material and pillar material intact. In one embodiment of the invention, a passivation layer is formed on the second interconnect level prior to dissolving the temporary material. The air gap dielectric can be used with more than two levels of interconnect, if desired.

12 Claims, 5 Drawing Sheets

DISSOLVABLE DIELECTRIC METHOD

BACKGROUND OF THE INVENTION

1. Field of the Invention

This invention relates to semiconductor device fabrication and more particularly to a method and structure for reducing capacitive coupling by first forming a multilevel interconnect structure and then dissolving or otherwise removing the interlevel material so that the interlevel dielectric comprises air.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memory and input/output devices by certain bus structures. There are numerous types of busses which are classified according to their operation. Examples of well-known types of busses include address busses, data busses, and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlaid with a dielectric present a topography upon which a subsequent layer of conductors can be patterned.

Conductors are made from an electrically conductive material, a suitable material includes Cu, Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type and/or n-type ions. Active devices are contacted by the conductors to form an integrated circuit.

Generally speaking, interconnect lines (or conductors) are fashioned upon the topography and spaced above an underlying conductor or substrate by a dielectric of thickness $T_{d1}$. Each conductor is dielectrically spaced from other conductors within the same level of conductors by a distance $T_{d2}$. Accordingly, interlevel capacitance $C_{LS}$ (i.e., capacitance between conductors on different levels) is determined as follows:

$$C_{LS} \approx \epsilon W_L L / T_{d1} \qquad \text{(Eq. 1)}$$

Further, the intralevel capacitance $C_{LL}$ (i.e., capacitance between conductors on the same level) is determined as follows:

$$C_{LL} \approx \epsilon T_c L / T_{d2} \qquad \text{(Eq. 2)}$$

where $\epsilon$ is the permittivity of the dielectric material, $W_L$ is the conductor width, $T_c$ is the conductor thickness, and $L$ is the conductor length. The resistance R of the conductor is calculated as follows:

$$R = (\rho L) / W_L T_c \qquad \text{(Eq. 3)}$$

where $\rho$ represents resistivity of the conductive material, and $T_c$ is the interconnect thickness. Combinations of equations 1 and 3, and/or equations 2 and 3 indicate the propagation delay of a conductor as follows:

$$RC_{LS} \approx \rho \epsilon L^2 / T_c T_{d1}$$

$$RC_{LL} \approx \rho \epsilon L^2 / W_L T_{d2} \qquad \text{(Eq. 4)}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible within the geometric constraints of the semiconductor topography.

Equation 4 shows that the propagation delay of a circuit is determined by parasitic capacitance values ($C_{LL}$) between laterally spaced conductors, and parasitic capacitance values ($C_{LS}$) between vertically spaced conductors or between a conductor and the underlying substrate. As circuit density increases, lateral spacing and vertical spacing between conductors decrease and capacitance $C_{LL}$ increases. Meanwhile, planarization mandates to some extent a decrease in vertical spacing. Shallow trench processing, recessed LOCOS processing, and multi-layered interlevel dielectrics can bring about an overall reduction in vertical spacing and therefore an increase in $C_{LS}$. Depending upon the geometries associated with a particular device, either $C_{LL}$ or $C_{LS}$ can reduce the performance of the device. Integrated circuits which employ narrow interconnect spacings thereby define $C_{LL}$ as a predominant capacitance, and integrated circuits which employ thin interlevel dielectrics define $C_{LS}$ as a predominant capacitance.

It is therefore important to minimize propagation delay especially in critical speed paths. Given the constraints of chemical compositions, it is not readily plausible to reduce the resistivity $\rho$ of conductor materials. Geometric constraints make it difficult to increase conductor thickness $T_c$ or dielectric thickness $T_{d1}$ or $T_{d2}$. Still further, instead of reducing length L of a conductor, most modern integrated circuits employ long interconnect lines which compound the propagation delay problems. Accordingly, a need arises for instituting a reduction in propagation delay within the chemical and geometric constraints of existing fabrication processes. It is therefore desirable that a fabrication process be derived that employs a low permittivity dielectric material.

The permittivity of any given material is commonly expressed as a product of the permittivity constant ($\epsilon_0$ = 8.854×10$^{-14}$) and the dielectric constant (K) of the material. Dielectric constants for various materials are shown in Table A.

TABLE A

| Material | Dielectric Constant |
| --- | --- |
| Titanium dioxide | 100 |
| Water | 78 |
| Silicon | 11.8 |
| Silicon Nitride | 6–9 |
| CVD Oxide | 3.8–4.5 |

TABLE A-continued

| Material | Dielectric Constant |
| --- | --- |
| Thermal Silicon Dioxide | 3.8–4.0 |
| Air | 1.00054 |
| Vacuum | 1.00000 |

Table A reveals that the materials commonly encountered in semiconductor manufacturing have dielectric constants at least three times greater than the dielectric constant of air. Processing techniques that incorporate air gaps into an interlevel dielectric material such as silicon dioxide achieve some reduction in the overall permittivity of the dielectric structure but fall far short of the reduction in capacitive coupling that could be achieved if the interlevel dielectric was entirely comprised of air. It would therefore be desirable to fabricate a multilevel interconnect structure in which the interlevel dielectric is air. Achieving such a structure requires consideration of how to provide adequate physical support for each interconnect level and how to protect each interconnect level from physical damage and moisture. These goals must be achieved without adding undue complexity or expense to the manufacturing process.

SUMMARY OF THE INVENTION

The problems outlined above are in large part addressed by a fabrication process that produces an air gap dielectric. A multi-level interconnect structure is formed upon a temporary supporting material and after formation of the multilevel structure, the temporary material is dissolved away leaving behind an intralevel and an interlevel dielectric comprised entirely of air. In one embodiment of the invention, a first interconnect level is formed on a barrier layer. A temporary support material is then formed over the first level interconnect and a second level of interconnect is formed on the temporary support material. Prior to formation of the second interconnect level, a plurality of pillar openings are formed in the temporary material. In addition to providing a contact between the first and second level of interconnects, the pillars provide mechanical support for the second interconnect level. In one embodiment of the invention, the temporary material is dissolved after formation of second interconnect level. The temporary material is dissolved in a solution that attacks the temporary material but leaves the interconnect material and pillar material intact. In another embodiment of the invention a passivation layer is formed on the second interconnect level prior to dissolving the temporary material. Contact openings are formed in the passivation layer so that the dissolving solution can pass through the passivation layer and attack the temporary material underneath. After the temporary material is etched away in this embodiment, a dielectric material is deposited on the passivation layer to cap the openings in the passivation layer. In one embodiment, the dielectric material comprises oxide formed from a silane source such that the deposition of the oxide results in cusping. As the oxide cusps over the contact in the passivation layer, the contact is sealed off. A subsequent passivation layer may optionally be deposited on the capping dielectric.

In one embodiment of the invention, formation of pillars includes the formation of structures which extend downward from the second dielectric to the barrier layer. Unlike the contact structures, these structures do not contact the first interconnect level. In one exemplary embodiment of the invention, the material used from the interconnect pillars and the material used to form the support pillars are the same. In another embodiment, the interconnect pillars can be formed first using a conductive material and followed up by formation of the support pillars in which case the support pillars can be comprised in the dielectric material.

Broadly speaking, the present invention contemplates a method for forming interconnect levels on a semiconductor substrate. First, a barrier layer is formed on the substrate. In alternative embodiments, the barrier layer may be comprised of undoped polysilicon or silicon nitride. After the barrier layer has been formed, a first interconnect level is formed on the barrier layer. The first interconnect level comprises a plurality of substantially coplanar first conductors. The formation of the first interconnect level may be accomplished with alternative processes. In a first process, first interconnect level is formed by depositing a conductive material on a barrier layer, patterning a photoresist layer over the conductive material, and etching the conductive material in a conventional photolithography process. In an alternative embodiment, formation of the first interconnect level can be accomplished by a damascene process in which a dielectric material is deposited on the barrier layer, a plurality of trenches are formed in the dielectric material, and a conductive material is deposited into the trenches and polished back to form a plurality of substantially coplanar conductors.

After formation of the first interconnect level, a first temporary support layer is formed on the first interconnect level. The temporary support layer provides temporary mechanical support for subsequent interconnect levels. A plurality of vias are then etched into first temporary support layer. The vias are filled with a conductive material to form a plurality of permanent support pillars. These support pillars have upper ends substantially coplanar with an upper surface of the temporary support layer. One or more of the permanent support pillars contacts one or more of the plurality of first conductors. In one embodiment, additional support pillars may extend from an upper surface of the first temporary support layer. These pillars serve as support pillars for the second interconnect level. After the permanent support pillars have been formed, a second interconnect level is formed on the first temporary support layer. The temporary material in the first temporary support layer is then removed with a wet etch process that dissolves the temporary material. In one embodiment of the invention a temporary material comprises a porous oxide that etches rapidly in an HF solution. The HF solution used to remove a temporary support material attacks the temporary support material but leaves intact the first and second interconnect levels, the support pillars, and the barrier layer.

The present invention further contemplates the interconnect structure described above and further comprises the formation of a passivation layer on the second interconnect level. The passivation layer, in one exemplary embodiment, comprises silicon nitride. A plurality of openings are etched into the passivation layer. After the passivating layer and the openings in the passivating layer have been formed, the temporary material and the first temporary support layer can be removed using an HF solution as described above. This process results in an intra and interlevel dielectric entirely comprised of air and having a passivation layer for subsequent processes.

The present invention further contemplates a multi-level interconnect structure comprising a semiconductor substrate, a barrier layer arranged on the substrate, a spaced set of first conductors arranged on the barrier layer, a plurality of vertically oriented interconnect pillars extending upward from the first conductors, and a spaced set of substantially planar second conductors displaced above the first conductors. The spaced set of second conductors is supported above the first conductors by upper ends of the plurality of interconnect pillars. In one embodiment of the invention, the barrier layer comprises silicon nitride, while in another embodiment the barrier layer comprises undoped polysilicon. The first and second conductors are preferably comprised of aluminum, tungsten, or copper. In one embodiment, the interconnect structure contains a plurality of vertically oriented support pillars extending upward from said barrier layer to a lower surface of the second conductors.

The present invention still further contemplates a multi-level interconnect structure. The interconnect structure comprises first set of spaced conductors arranged upon a first plane, a second set of spaced conductors arranged upon a second plane, wherein the second plane is vertically displaced above and substantially parallel to the first plane, and a plurality of support pillars extending upward from an upper surface of the first conductors to a lower surface of the second conductors for supporting the second conductors in the second plane.

BRIEF DESCRIPTION OF THE DRAWINGS

Other objects and advantages of the invention will become apparent upon reading the following detailed description and upon reference to the accompanying drawings in which.

Figure 1:
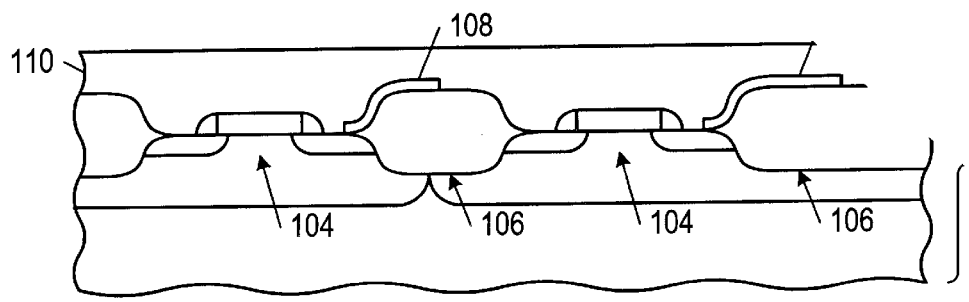
FIG. 1 is a partial cross-sectional view of a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
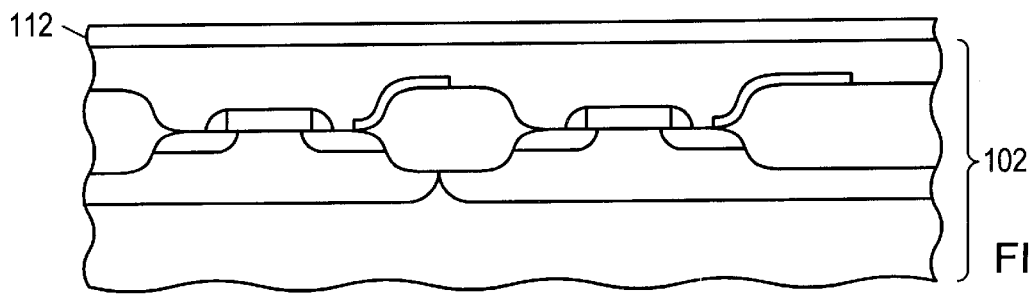
FIG. 2 is a processing step subsequent to FIG. 1, in which a barrier layer has been formed on the semiconductor substrate.

Turning now to the drawings, FIG. 1 shows a semiconductor substrate 102. Substrate 102 comprises a plurality of isolated transistor regions 104 separated by isolation regions 106. Formation of transistor regions 104 is generally known in the art. In the embodiment shown in FIG. 1, isolation regions 106 is formed with a field oxidation step. Alternatively, in an embodiment not shown in the figure, the plurality of transistors 104 could be isolated with shallow trench isolation structures. FIG. 1 also shows a local interconnect structure 108 for selectively coupling various transistors 104 and a dielectric 110 for isolating the plurality of active transistors 104 from subsequent processing steps. For purposes of this disclosure, the entire structure 102 is referred to as a semiconductor substrate. In FIG. 2, a barrier layer 112 is formed on semiconductor substrate 102. Barrier layer 112 is blanket deposited on semiconductor substrate 102 and is intended to isolate substrate 102 from the region above barrier layer 112. As discussed in greater detail below, a temporary material will be formed on barrier layer 112 and subsequently dissolved away with a solvent. The dissolving agent is any fluid which can remove temporary material, whatever that material comprises. In one embodiment, the temporary material may be comprised of an oxide. In this embodiment, it is necessary to isolate the various oxides contained in semiconductor substrate 102 from the solvent used to dissolve away the temporary material above barrier layer 112. Accordingly, barrier layer 112 material must be chosen such that the solvent used to etch away the temporary material does not attack the barrier layer. In an embodiment in which the temporary material is comprised of oxide and the solvent used to dissolve away the oxide comprises a wet HF solution, barrier layer 112 may be comprised of undoped polysilicon or silicon nitride.

Figure 3:
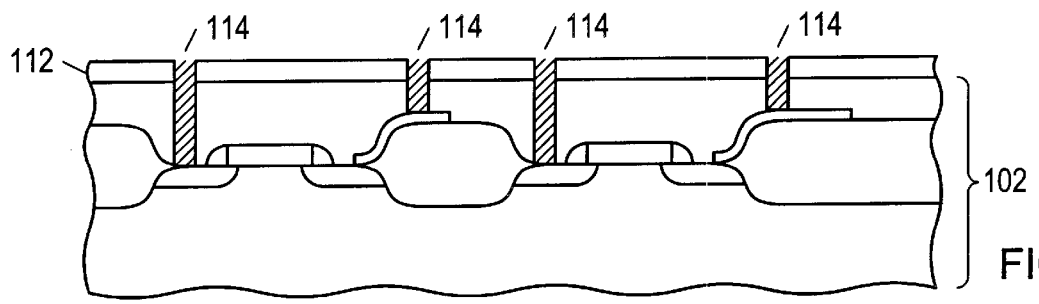
FIG. 3 is a processing step subsequent to FIG. 2, in which a plurality of contact structures have been formed through the barrier layer and into the semiconductor substrate.
Figure 4A:
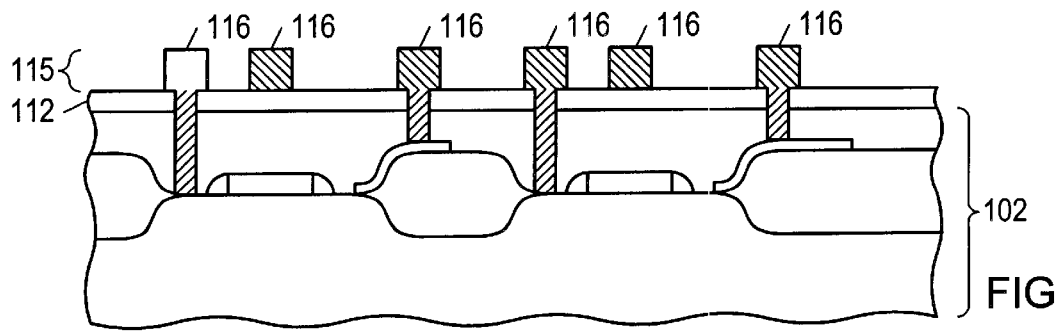
FIG. 4A is a processing step subsequent to FIG. 3, in which a first interconnect level comprising a plurality of spaced conductors has been formed on the barrier layer.
Figure 4B:
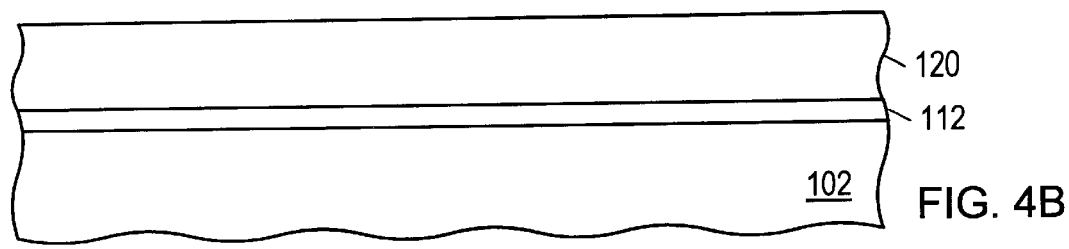
FIGS. 4B–4E show an alternative process sequence for forming a first interconnect level.
Figure 4C:
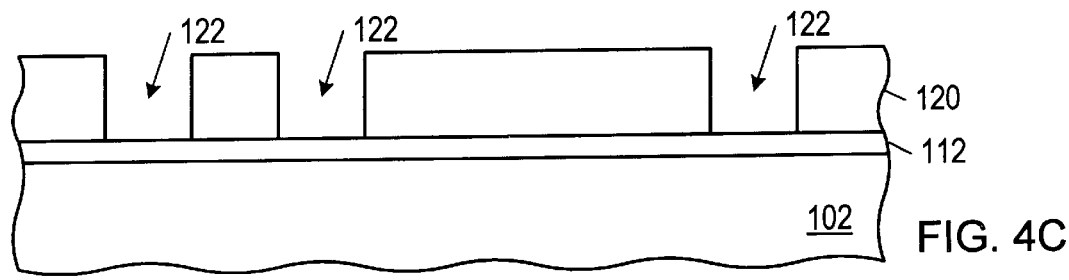

Turning now to FIG. 3, a plurality of contact structures 114 are formed in barrier layer 112 and semiconductor substrate 102. The plurality of contacts 114 are designed to selectively couple a subsequent interconnect level with the underlying transistor regions 104. In the embodiment shown in FIG. 3, the contacts 114 are formed by etching a contact via into barrier layer 112 and substrate 102 and then plugging the contact via with a conductive material. Alternatively, in an embodiment not shown, the plurality of contacts 114 may be filled with conductive material when the first interconnect level is deposited on barrier layer 112. FIG. 4A shows a subsequent processing step in which a first interconnect level 115 is formed on barrier layer 112. First interconnect level 115 is comprised of a plurality of spaced first conductors 116. First conductors 116 are preferably comprised of aluminum, copper, or tungsten. Formation of first interconnect level 115 and first conductors 116 can be accomplished by depositing a conductive material on barrier layer 112, patterning a photoresist layer on top of the conductive material, and etching the conductive material to form the plurality of spaced conductors 116.

Figure 4D:
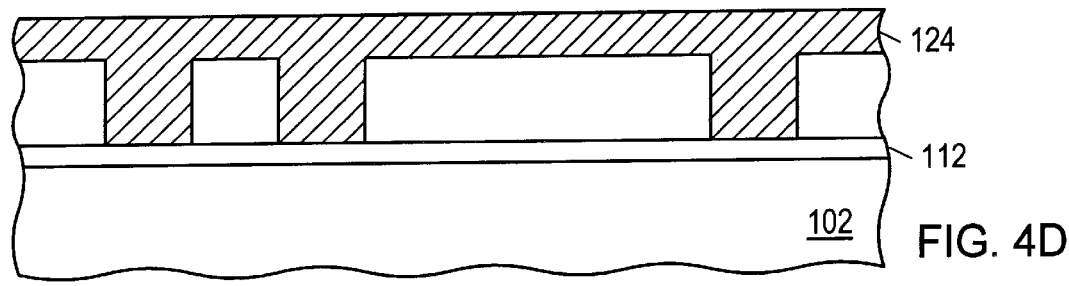
Figure 4E:
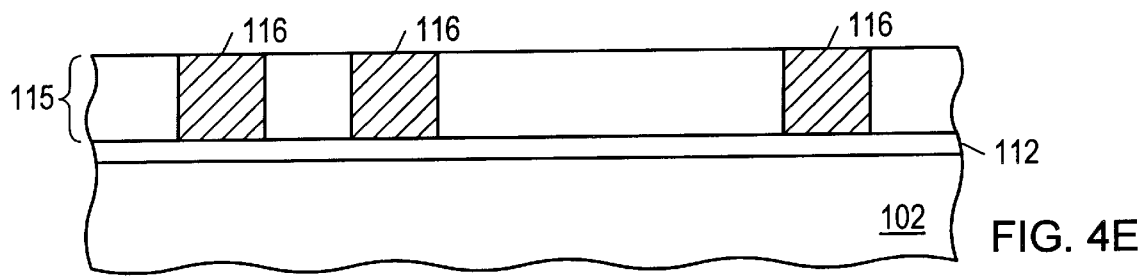

Alternatively, in an embodiment shown in FIGS. 4B–4E, first interconnect level 115 can be formed using a damascene process. In the damascene process shown in FIGS. 4B–4E, a first intralevel temporary material 120 is formed on barrier layer 112. A plurality of trenches 122 is then etched into first intralevel temporary layer 120. A conductive material is deposited on and into the trenches as shown in FIG. 4D. After the deposition of the conductive material, a chemical-mechanical polish is performed to polish conductive material 124 back to an upper surface of the first temporary intralevel dielectric 120. The use of a damascene process to form first interconnect level 115 results in a dielectric or temporary material arranged between the individual conductors 116 whereas formation of interconnect level 115 by means of the process shown in FIG. 4A results in the conductors 116 being formed with no intervening material.

Figure 5:
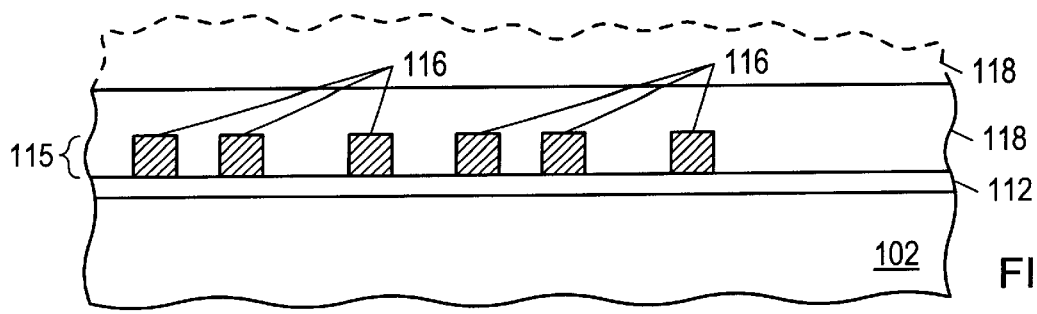
FIG. 5 is a processing step subsequent to FIG. 4, in which a first temporary support layer has been formed on the first interconnect level.
Figure 6:
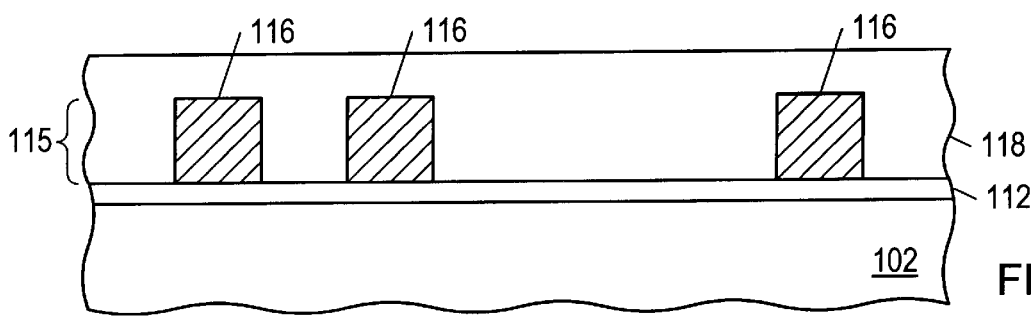
FIG. 6 is a alternative embodiment of the partial cross-sectional view shown in FIG. 5.
Figure 7:
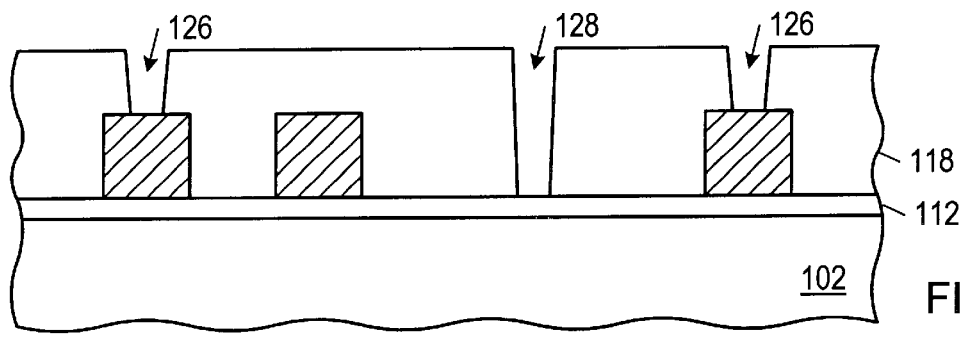
FIG. 7 is a processing step subsequent to FIG. 6a, in which a plurality of vias have been formed in the first temporary layer.

Turning now to FIG. 5, first temporary layer 118 is shown formed upon first dielectric layer 115. First temporary layer 118 is typically deposited such that first temporary layer 118 comprises a plurality of elevational peaks and valleys. In FIG. 5, first temporary layer 118 is shown as having a substantially planar upper surface produced by planarizing the peaks and valleys with a chemical-mechanical polish, resist etchback, or other planarization process. Portions of first temporary layer 118 removed during the planarization process are represented in FIG. 5 by the dotted line. It should also be noted that in FIG. 5, detail has been omitted from semiconductor substrate 102 for the sake of clarity. FIG. 6 is simply a cross-sectional view of an enlarged portion of the view shown in FIG. 5. Turning now to FIG. 7, a plurality of contact pillar tunnels 126 and support pillar tunnels 128 are formed in first temporary layer 118. As seen in the figure, contact pillar tunnels 126 extend from an upper surface of first layer 118 to an upper surface of first conductor 116. Support pillar tunnels 128 extend from an upper surface of the first temporary layer 118 to an upper surface of barrier layer 112. As will be discussed in greater detail below, contact pillar tunnels 126 are located where contacts between the first interconnect level 116 and a subsequent interconnect level will be formed. Support pillar tunnels 128 are located where support pillars will be subsequently formed. Support pillars are solely intended to provide mechanical support for a subsequent interconnect level and, as such, provide no electrical path to another interconnect level.

Figure 8:
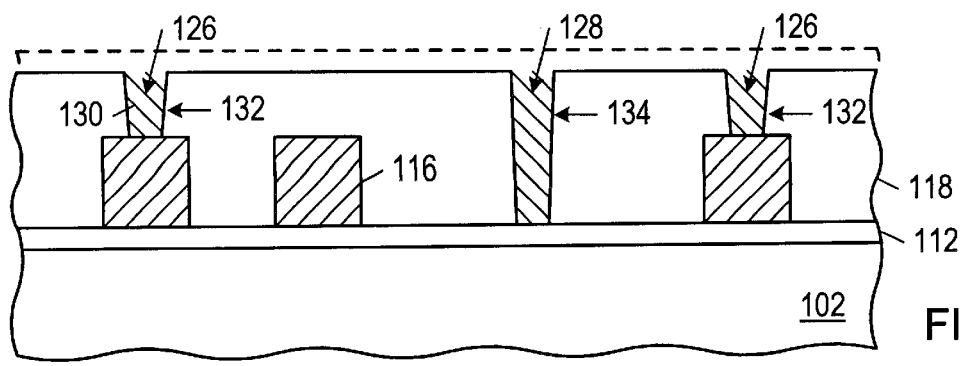
FIG. 8 is a processing step subsequent to FIG. 7, in which a conductive material has been deposited in the contact vias and polished back.

In FIG. 8, support pillar tunnels 128 and contact pillar tunnels 126 are filled with a conductive material 130. The filling of the contact structures with a conductive material is preferably accomplished with a chemical vapor deposition using a tungsten source. In other embodiments however, conductive material 130 may be comprised of copper, aluminum, tungsten, titanium, or a combination thereof. Deposition of conductive material 130 in pillar tunnels 126 and 128 is preferably followed by a polish back of conductive material 130. Conductive material 130 polished away during this polish process is represented in FIG. 8 by the dashed lines. After the excess material 130 has been removed from layer 118 upper surface, contact pillars 132 and support pillars 134 remain. As noted above, support pillars 134 do not provide an electrical connection between second interconnect levels. Instead, support pillars 134 are solely intended to provide mechanical support for conductor 136 located within second interconnect level 135, shown in FIG. 9. Generally, support pillars 134 would be required wherever a conductor 136 within second interconnect level 135 traverses a long distance without encountering a contact pillar 132. A procedure for generating the pillar mask used to form interconnect pillar tunnels 126 and support pillar tunnels 128 might involve a sequence similar to the following. First, the second interconnect level mask will be compared to the location of contact pillar tunnels 126 to determine sections of second conductors 136 which span a specified distance without encountering a subsequent contact pillar tunnel. In those regions where second conductors 136 exceed the specified distance without encountering a contact pillar tunnel, first interconnect level 115 mask will be interposed to determine available locations for a support pillar tunnel 128. Placement of support pillars 128 must not create an inadvertent contact to first interconnect level 115. If it is determined that a particular second conductor 136 requires a supporting pillar but the density of first conductors 116 underneath second conductor 136 is too dense to allow placement of a pillar, one of two alternatives is available. The first alternative involves rerouting second conductor 136 to a region over a less dense area of first interconnect level 115. The second alternative would require that a separate mask be used for formation of support pillar tunnels 128. If contact pillars 126 and support pillar tunnels 128 were formed separately, support pillar tunnels 128 could be filled with a non-conductive material so that the placement of support pillar tunnels 128 could be accomplished without regard to the underlying density of first interconnect level 115. This added flexibility in locating support pillars 128 would be at the expense of additional processing steps.

Figure 9:
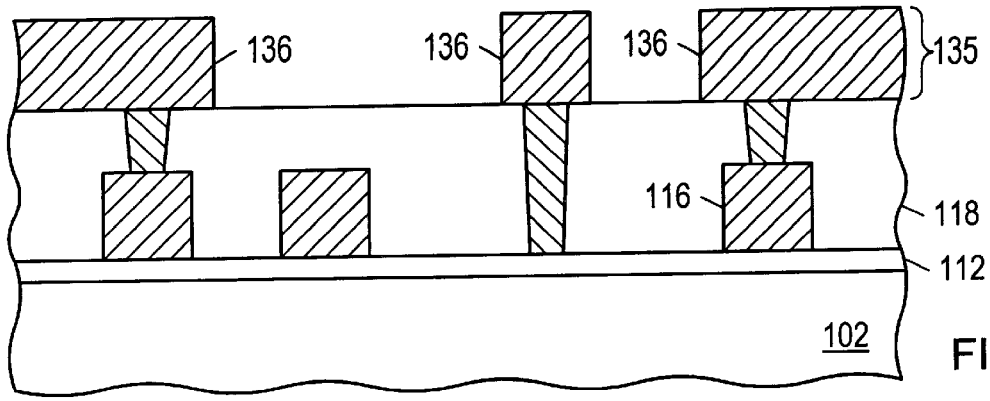
FIG. 9 is a processing step subsequent to FIG. 8, in which a second interconnect level has been formed on the first temporary material.
Figure 10:
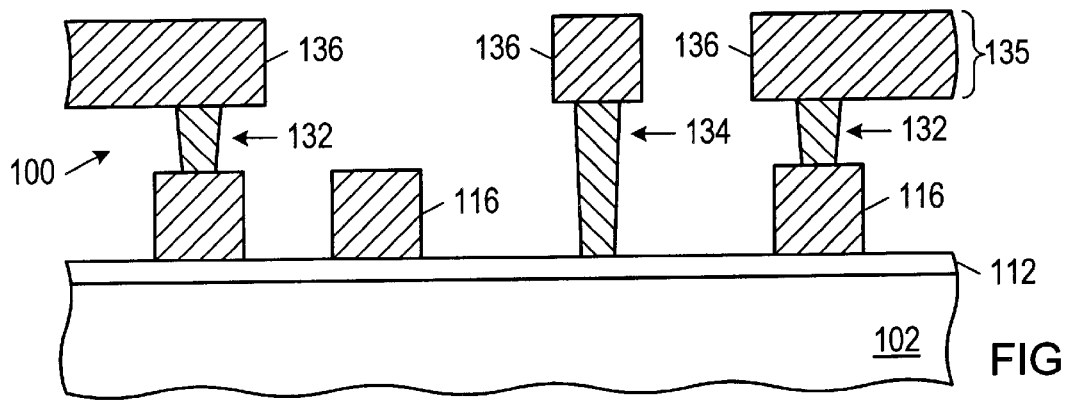
FIG. 10 is a processing step subsequent to FIG. 9, in which the first temporary layer has been removed.

Turning now to FIG. 9, second interconnect level 135 is formed on an upper surface of first temporary layer 118. Similar to the formation of first interconnect level 115, the formation of second interconnect level 135 can be accomplished with a "conventional" metalization process or with a damascene process. In the specific embodiment shown in FIG. 9, the formation of second interconnect level 135 is accomplished by depositing a conductive material, patterning a photoresist layer on top of the conductive material, and selectively etching the conductive material to form a plurality of second conductors 136. Conductive material used for second interconnect level 135 preferably comprises aluminum or copper. FIG. 10 shows a processing step subsequent to that shown in FIG. 9 in which first temporary layer 118 has been removed. Removing first temporary layer 118 results in the multilevel interconnect structure 100 shown in FIG. 10. Multilevel interconnect structure 100 comprises barrier layer 112 formed on substrate 102. A first set of substantially coplanar conductors 116 is formed on barrier layer 112. A plurality of vertically oriented contact pillars 132 extend apart from first conductors 116. A spaced set of second conductors 136 is arranged upon a second plane. The second plane is vertically displaced above and substantially parallel to the plane defining barrier layer 112. Second conductors 136 are supported in the second plane by upper ends of contact pillars 132. In an embodiment of the present invention in which it is necessary to incorporate support pillars 134, multilevel interconnect structure 100 comprises a plurality of support pillars 134 extending from an upper surface of barrier layer 112 to a lower surface of second conductor 136. As seen in FIG. 10, multilevel interconnect structure 100 comprises a dielectric material comprised of air between adjacent conductors 116 of first interconnect level 115, adjacent conductors 136 of second interconnect level 135, and between first conductor 116 and second conductor 136. Because the dielectric constant of air is approximately equal to 1, the capacitive coupling between adjacent conductors within a singular interconnect level and the capacitive coupling between conductors located in different interconnect levels is minimized. Minimization of capacitive coupling results in circuits that are able to transition more rapidly which translates into devices that operate at high speeds. Because first conductors 116 and second conductors 136 are exposed to the atmosphere in the embodiment shown in FIG. 10, the interconnects are susceptible to physical damage and to moisture. If it is desired to use the structure shown in FIG. 10 without some form of passivation layer, special handling procedures will be required and hermetic packaging will be necessary to prevent moisture penetration into the conductive material of first and second interconnect levels.

Figure 11:
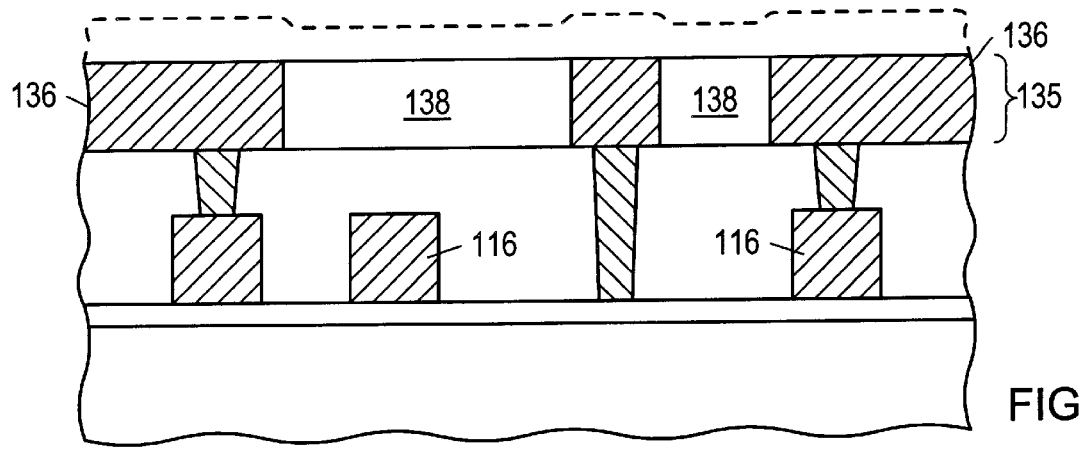
FIG. 11 is a processing step subsequent to FIG. 9, in which a second temporary layer has been formed on the first temporary layer and etched back so that an upper surface of the second temporary layer is substantially coplanar with an upper surface of the second interconnect level.
Figure 12:
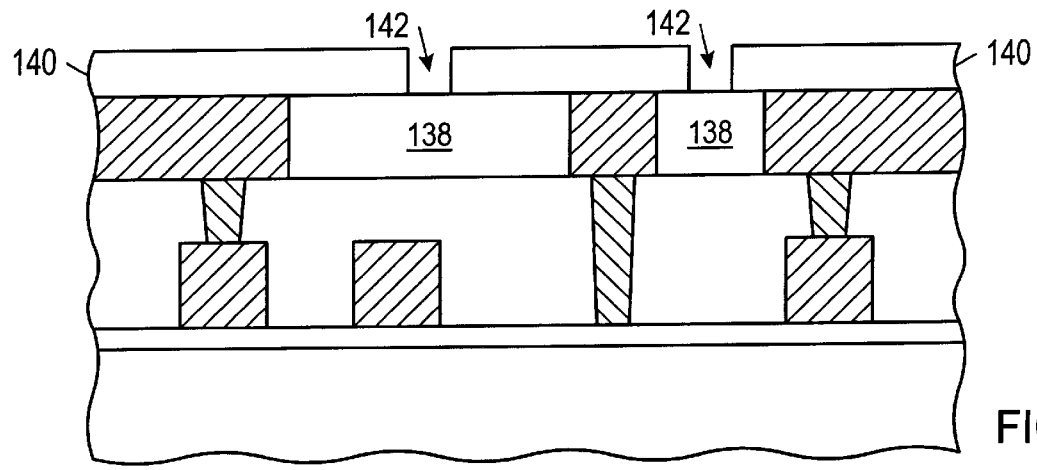
FIG. 12 is a processing step subsequent to FIG. 11, in which a passivation layer has been formed on the second interconnect level and the second temporary material and a plurality of contact vias have been etched in the passivation layer.
Figure 13:
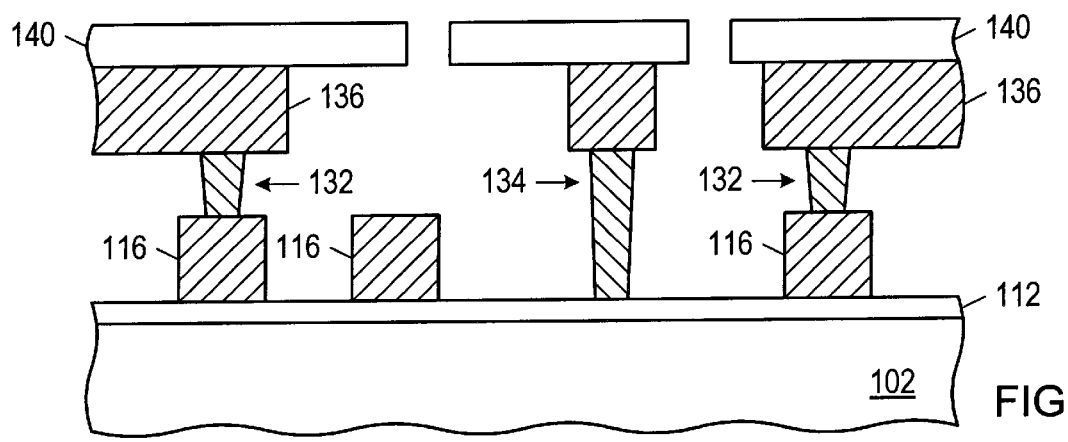
FIG. 13 is a processing step subsequent to FIG. 12, in which the first and second temporary layers have been removed.
Figure 14:
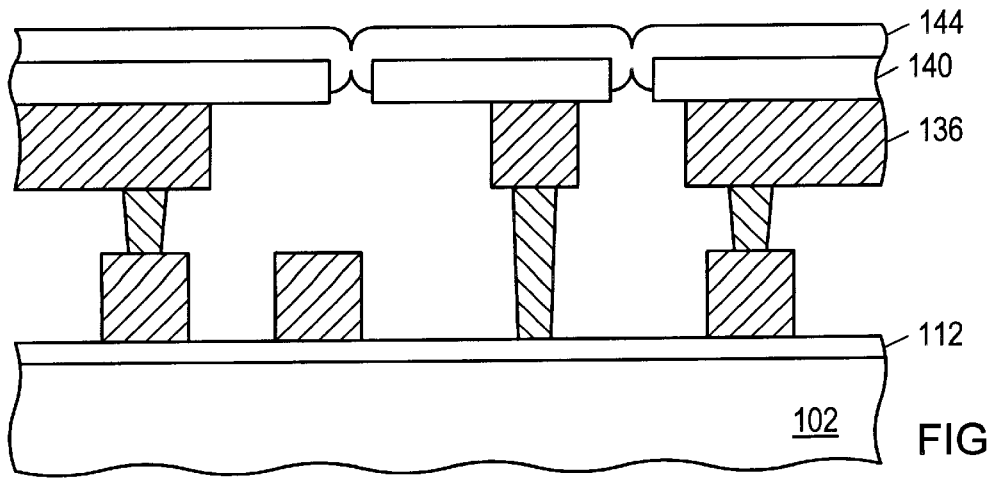
FIG. 14 is a processing step subsequent to FIG. 13, in which a capping dielectric has been formed on the passivation layer.

Turning now to FIGS. 11 through 14, a process sequence is shown for fabricating a passivation layer on top of second interconnect level 135. A passivation layer would provide mechanical protection for the underlying structure and will prevent moisture penetration into first and second interconnects 116 and 136, respectively. FIG. 11 shows a processing step subsequent to that shown in FIG. 9 in which a second temporary layer 138 has been formed. Formation of second temporary layer 138 comprises a deposition step in which temporary material is deposited on the topography defined by second conductors 136 and first temporary layer 118. Thereafter, a planarization step is performed to planarize second temporary layer 138 back to an upper surface of second interconnect level 135. It should be noted that, in an embodiment in which second interconnect level 135 is formed with a damascene process, second temporary layer 138 is unnecessary because a temporary material will already be present between adjacent conductors 136 of second interconnect level 135. Turning now to FIG. 12, a passivation layer 140 is formed on an upper surface of second dielectric layer 135. Passivation layer 140 is preferably comprised of silicon nitride or silicon oxynitride. A plurality of passivation openings 142 is subsequently etched into passivation layer 140 as shown in FIG. 12. Formation of passivation openings 142 is preferably accomplished with a dry etch process. Passivation layer openings 142 provide a path for a solvent to reach the temporary material underlying passivation layer 140. FIG. 13 shows a processing step subsequent to that shown in FIG. 12, whereby all temporary layers previously formed have been dissolved and removed or, in the alternative, dissolved but not removed thereby changing the chemical and electrical characteristics to present either an air gap or an insulative material where the temporary layers pre-existed. In an embodiment in which first temporary layer 118 and second temporary layer 138 comprise an oxide, the solvent that is used to remove the temporary material is comprised of an HF solution as noted above. FIG. 14 shows a subsequent processing step in which a capping dielectric has been deposited on passivation layer 140 to seal off passivation vias 142. Formation of capping dielectric 144 should preferably be performed in an environment conducive to forming a cusping dielectric. The deposition of an oxide in a chemical vapor deposition chamber using a silane source at atmospheric pressure or low pressure can be used to accomplish the necessary cusping. The reaction can be a plasma enhanced reaction, if desired. A second passivation layer, not shown in the drawing, may be deposited on capping dielectric 144. The passivation layer can employ SiN material.

It will be appreciated to those skilled in the art of semiconductor manufacturing having the benefit of this disclosure that this invention is generally useful in providing a multilevel interconnect structure in which new permittivity is minimized. It is understood that the form of the invention shown and described in the detailed description and the drawings is to be taken merely as presently preferred examples of how a dissolvable dielectric can be integrated into a semiconductor interconnect process. It should also be understood that the process sequence shown and described in FIGS. 4–9 can be repeated for subsequent interconnect levels. In this manner, third, fourth and subsequent metalization layers can be formed upon temporary supporting material prior to the removal of the temporary material. It is intended that the following claims be interpreted broadly to embrace all these variations of the preferred embodiments disclosed.

What is claimed is:

1. A method of fabricating interconnect levels on a semiconductor substrate comprising:

forming a barrier layer on said substrate;

forming a first interconnect level on said barrier layer wherein said first interconnect level comprises a plurality of substantially coplanar first conductors;

forming a first temporary support material on said first interconnect level, said first temporary support material comprising an upper surface and a lower surface;

forming a plurality of vias in said first temporary support material, said plurality of vias extending from said upper surface of said first temporary support material to said lower surface of said first temporary support material and wherein at least one of said plurality of vias communicates with one or more of said first conductors;

filling said plurality of vias with a conductive material to form a plurality of permanent support pillars having an upper end substantially coplanar with said upper surface of said first temporary support material, wherein at least one of said permanent support pillars contacts at least one of said plurality of first conductors;

forming a second temporary support material and a second interconnect level on said first temporary support layer wherein said second interconnect level comprises a plurality of substantially coplanar second conductors spaced apart by said second temporary support material; and concurrently removing said first and second temporary support materials from said first and second interconnect levels such that said plurality of second conductors are separated from said first conductors by air and wherein said second conductors are supported above said plurality of first conductors by said plurality of permanent conductive pillars.

2. The method of claim 1 wherein said barrier layer comprises silicon nitride.

3. The method of claim 1 wherein said barrier layer comprises undoped polysilicon.

4. The method of claim 1 wherein said barrier layer comprises metal oxide.

5. The method of claim 1 wherein the step of forming said first interconnect level comprises depositing a conductive material on said barrier layer, patterning a photoresist layer on said conductive material, and etching said conductive material to produce said plurality of substantially coplanar first conductors.

6. The method of claim 5 wherein said conductive material comprises aluminum, copper, or tungsten.

7. The method of claim 1 wherein said conductive material comprises aluminum, copper, or tungsten.

8. The method of claim 1 wherein said temporary material comprises oxide formed from a chemical vapor deposition process using a TEOS or silane source.

9. The method of claim 1 wherein said forming a second temporary support material and a second interconnect level comprises depositing said temporary support material on said first temporary support material, etching a plurality of second trenches into said second temporary support material, depositing a conductive material in said plurality of second trenches, and polishing back said conductive material to produce said plurality of substantially coplanar second conductors.

10. The method of claim 1 wherein the step of forming said second interconnect level comprises depositing a conductive material on said first temporary support layer, patterning a photoresist layer on said conductive material, and etching said conductive material to produce said plurality of substantially coplanar first conductors.

11. The method of claim 1 further comprising:
   depositing a passivation layer on said second interconnect level; and
   etching a plurality of vias through said passivation layer wherein said passivation layer vias are horizontally displaced from said second conductors.

12. The method of claim 11 further comprising depositing a capping dielectric layer on said passivation layer.

* * * * *